Nov. 11, 1969 J. HAMBOR 3,478,252

SERIES RECTIFIER STOCK AND CAPACITOR IN SHUNT

Filed Nov. 6, 1967

INVENTOR.
JOHN HAMBOR
BY Howard T. Jeandron
AGENT

United States Patent Office
3,478,252
Patented Nov. 11, 1969

3,478,252

SERIES RECTIFIER STACK AND CAPACITOR IN SHUNT

John Hambor, Long Branch, N.J., assignor to Atlantic Semiconductor, Division of Aerological Research, Inc., Asbury Park, N.J., a corporation of Delaware

Filed Nov. 6, 1967, Ser. No. 680,661
Int. Cl. H01g *9/16;* H01l *3/00, 5/00*
U.S. Cl. 317—233 6 Claims

ABSTRACT OF THE DISCLOSURE

A compensated high voltage silicon rectifier comprising silicon p-n junctions and capacitors in which the p-n junction elements are in stacked configuration and the compensating capacitors are in parallel across the stacked element.

This invention relates to high voltage silicon rectifiers and more particularly to a miniaturized compensated high voltage silicon rectifier assembly.

In the past strings of silicon rectifiers (commonly referred to as diodes) were connected in series to form a high voltage rectifier stack for high voltage work. When a number of silicon diodes are connected in series to achieve voltage rectification in the 10,000 to 500,000 volt range, the diodes nearest the high voltage end of the string would deteriorate and lose their voltage rectifying property. As a result, if the string of silicon diodes were left in continual operation, the entire series of diodes would be destroyed. As an improvement in the art compensation such as shunting capacitors were added to provide successful operation.

An object of this invention is to provide a compensated silicon rectifier assembly by combining capacitors and matched avalanche silicon rectifiers to provide a significant increase in the total capacitance of the complete assembly.

A further object of this invention is to provide a compensated silicon rectifier assembly by combining capacitors and matched avalanche silicon rectifiers to provide an increase of total capacitance to in turn provide a much improved peak electrical storage of energy and power dissipation to minimize the destructive effects of transient voltages across the high voltage silicon diodes at the top or nearest to the high voltage end of the rectifier assembly.

Figure 1:
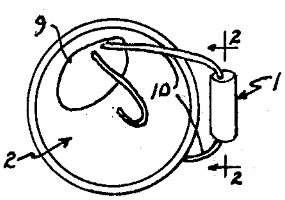
Figure 2:
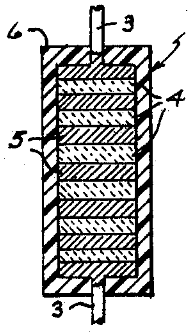
Figure 3:
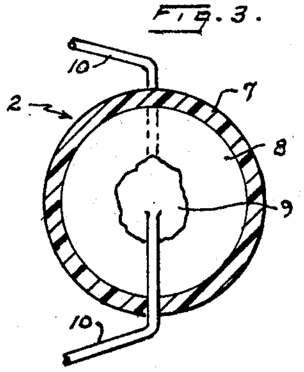
Figure 4:
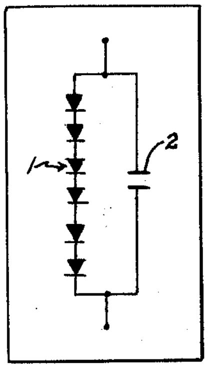
Figure 5:
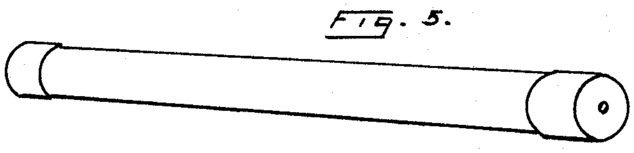
Figure 6:
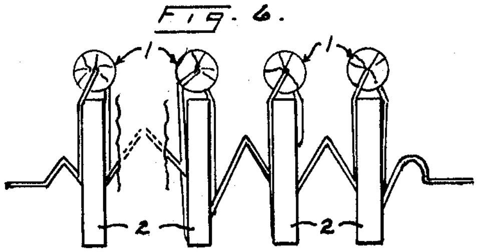
Figure 7:
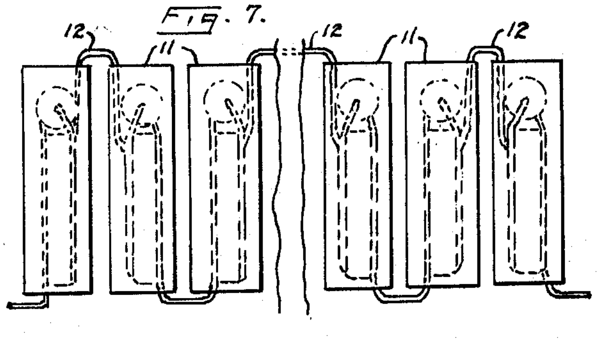
Figure 8:
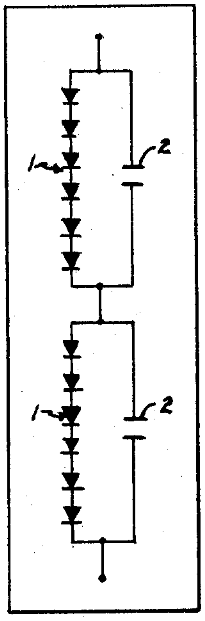
Figure 9:
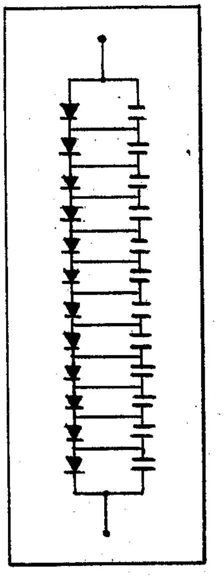

Further objetcs of this invention shall be apparent by reference to the accompanying detailed description and the drawings in which FIG. 1 illustrates in plan view a high voltage ceramic capacitor electrically connected to a high voltage silicon rectifier, FIG. 2 is an enlarged cross sectional view of the silicon rectifier taken on line 2—2 of FIG. 1, FIG. 3 is an enlarged end view of the ceramic capacitor of FIG. 1 shown partially in cross section, FIG. 4 is a schematic wiring diagram showing a single unit which includes a high voltage capacitor and a high voltage rectifier connected in parallel, FIG. 5 is a perspective view showing the compensated high voltage silicon rectifier with ferrule connectors at each end, FIG. 6 is a side view of the compensated high voltage silicon rectifier assembly showing how the rectifiers and diodes are positioned in spaced relationship, FIG. 7 is a side view of the compensated high voltage silicon rectifier assembly of FIG. 6 showing how the individual rectifiers and shunting capacitors are encapsulated, FIG. 8 is a schematic wiring diagram similar to FIG. 4 showing two single units connected in series to provide compensation, and FIG. 9 is a schematic wiring diagram showing the presently known compensated high voltage silicon rectifier assembly.

Referring to the drawings, and more particularly to FIGS. 1–3, there is shown the encapsulated silicon rectifier which is composed of a plurality of circular silicon p-n junction wafers 4 and a plurality of circular silver wafers 5, and two silver terminal nail-headed leads 3. In the manufacture of this multi-junction silicon rectifier all the component parts are mechanically soldered together as shown in FIG. 2; the entire structure is subjected to various chemical etchings and cleaning processes to achieve the desired rectifier electrical characteristics, and the entire assembly is then enapsulated in a standard encapsulating material such as epoxy 6. The various manufacturing processes involving chemical etching and cleaning and the encapsulation process are consistent with present state of art technology.

The incorporation of the circular silver preforms 5 between the silicon p-n junction wafers 4 provides for heat dissipation for the p-n junction wafers 4 thus greatly increasing the power dissipation of the multi-junction rectifier particularly when the rectifier is subject to large power surges in its reverse avalanche operational mode.

In FIG. 3 there is shown an end view of a ceramic-type capacitor. The metallized section of one side of the circular capacitor is shown by the area 8. The unmetallized portion of the ceramic capacitor is shown as the area 7. The metal terminal wires 10 are soldered to the metallized section at terminal 9. Needless to say, both sides of the circular capacitor are identical. For use in this invention the critical requirements for the ceramic capacitor are such that the ceramic material composing the capacitor is rated at a high dielectric constant and high dielectric strength. An example of a ceramic material of this type would be barium titanate. In FIG. 1 there is shown an end view of the encapsulated multi-junction silicon rectifier 1 electrically connected by means of solder connection at 9 with the ceramic-type capacitor 2. The solder connection on the reverse side of the capacitor 2 is identical to that shown in FIGS. 1 and 3. When joined together in this manner, the multi-junction rectifier 1 is usually referred to as being electrically connected in parallel with the capacitor 2.

FIG. 4 shows a schematic diagram of the parallel electrical connection of the multi-junction silicon rectifier 1 and the capacitor 2. Connected in this manner the capacitor is looked upon as compensating the silicon rectifier, and when a number of rectifiers and compensating capacitors are connected in series to produce high voltage, the total assembly is commonly referred to as a "compensated high-voltage silicon rectifier stack or assembly."

The ability of a compensated silicon rectifier assembly to withstand destructive transient voltage energy is improved by increasing its total capacitance as is evident in the well-known relationship $$E=\tfrac{1}{2}CV^2 \qquad (1)$$

where E is the energy in joules, C is the total capacitance of the compensated rectifier assembly in farads, and V is the magnitude of the voltage in volts.

The fact that compensation of silicon rectifier assemblies is obtained by adding shunting capacitors across the individual silicon rectifiers in series, the overall capacitance of the rectifier assembly is reduced by the well-known relationship for equal-value capacitors $$Ct=C/N \qquad (2)$$

where $C_t$ is the overall capacitance of the compensated silicon rectifier assembly, C is the capacitance of the capacitors, and N is the number of capacitors required to compensate the silicon rectifier assembly.

In the present state of the art, it is customary to use approximately a 1000 picofarad capacitor of approximately 1000 to 1500 volts of voltage breakdown in order to individually compensate each 600 volt or 1000 volt silicon rectifier connected in series to provide a compensated high voltage silicon rectifier assembly. A state of the art schematic diagram is shown in FIG. 9.

One of the prime features of the present invention is the use of a high voltage multi-junction silicon rectifier shown in FIG. 2, whose avalanche voltage breakdown is substantially greater than 600 to 1000 volts as now found in the present art. As an example, a six element silicon rectifier of mechanical structure similar to that shown in FIG. 2 and schematically in FIG. 4 would have an avalanche voltage of approximately 6000 volts. In this invention this high voltage multiple junction silicon rectifier, FIG. 2, is compensated with a high voltage capacitor similar to that shown in FIG. 3 and the schematic diagram is, as shown in FIG. 4. An example of the breakdown voltage for the compensating capacitor would be in the magnitude of 10,000 volts.

The prime feature of this invention is readily understood by comparing the schematic wiring diagrams of FIGS. 8 and 9, in which FIG. 8 represents this invention and FIG. 9 would represent a present state of the art 12,000-volt compensated silicon rectifier assembly consisting of twelve 1000-volt silicon rectifiers and twelve compensating capacitors; in comparison, FIG. 8 represents a 12,000-volt compensated silicon rectifier assembly consisting of only two 6000-volt multi-junction rectifiers and only two compensating capacitors. A comparison of the total capacitance, $C_t$, for the two compensated rectifier assemblies shown in FIG. 8 with the twleve compensated rectifiers in FIG. 9 readily shows that the total capacitance of the compensated rectifier assembly of FIG. 8 is a 1:6 ratio whereas FIG. 9 shows a 1:1 ration. Thus this invention provides a compensated rectifier assembly that is six times greater than that of the present state of the art compensated silicon rectifier assembly shown in FIG. 9. Also, the energy Equation 1 shows a corresponding six times improvement in ability to withstand destructive transient energy for the described assembly of this invention over that of the present state of the art.

Thus, in the design of any high voltage compensated silicon rectifier assembly, the combination of the multi-junction silicon rectifiers, FIG. 2, and high voltage capacitors, FIG. 3, results in a substantial increase in the total compensated assembly capacitance over that found in present state of art types. This large increase in total capacitance provides for a great improvement in electrical performance by minimizing the destructive effects of transient voltages across the silicon rectifiers nearest the high voltage end of the compensated silicon rectifier assembly.

Thus with a reduction in the number of rectifiers and compensating capacitors this invention reduces the assembly and provides miniaturization of compensated silicon rectifier assemblies. This is apparent by comparing the schematic wiring diagrams of FIG. 8 and FIG. 9 which illustrates diagrammatically the number of required silicon rectifiers and compensating capacitors reduced by a factor of six times. In view of the fact that the electrical operation of most high voltage applications such as X-ray machines, electrostatic paint spray equipment, etc. require an insulating oil ambient, the miniaturization of the compensated silicon rectifier assembly of this invention is quite significant in cost and size reduction.

It is to be noted that the diode or rectifier shown is selected as best fitted to this miniaturization and it is further understood that the diode may vary in size depending upon the amount of power required for a particular electrical end use. Although the rectifier is encapsulated with an epoxy, it may be similarly encapsulated with any other high voltage insulation material without departing from the spirit of this invention and this invention shall be limited only by the appended claims.

What is claimed is:

1. A capacitor compensated multi-junction silicon rectifier comprising at least three silicon p-n junction wafers retained in stacked relationship and conductive metal between said p-n junction wafers in said stack and a conductive metal on each end of the stack having a terminal lead, said conductive metal providing heat dissipation of said silicon p-n junction wafers upon large power surges in the reverse avalanche operational mode and a single capacitor having its respective electrodes connected to said terminal leads at the ends of said stack.

2. A capacitor compensated multi-junction silicon rectifier according to claim 1 in which said stack of silicon p-n junction wafers and said conductive metals are encapsulated within a high voltage insulation material.

3. A capacitor compensated multi-junction silicon rectifier according to claim 1 in which at least two compensated multi-junction silicon rectifiers stacks are connected in series.

4. In a capacitor compensated multi-junction silicon rectifier according to claim 1 in which said silicon p-n junction wafers are round in form.

5. In a capacitor compensated multi-junction silicon rectifier according to claim 1 in which said silicon p-n junction wafers are multiple sided figures.

6. A capacitor compensated multi-junction silicon rectifier according to claim 1 in which said metal between wafers is silver.

References Cited

UNITED STATES PATENTS

| | | | |
|---|---|---|---|
| 1,751,360 | 3/1930 | Ruben | 317—234 |
| 2,430,904 | 11/1947 | Baldingh | 317—234 |
| 2,750,540 | 6/1956 | Waldkotter et al. | 317—241 |
| 3,373,336 | 3/1968 | Schillmann et al. | 317—234 X |

FOREIGN PATENTS

| | | |
|---|---|---|
| 290,985 | 8/1929 | Great Britain. |

JAMES D. KALLAM, Primary Examiner

U.S. Cl. X.R.

317—234